US011170696B2

(12) United States Patent
Li et al.

(10) Patent No.: US 11,170,696 B2
(45) Date of Patent: Nov. 9, 2021

(54) GATE DRIVE CIRCUIT AND DISPLAY PANEL

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Yan Li, Beijing (CN); Meiling Jin, Beijing (CN); Xiaobo Xie, Beijing (CN); Lingyun Shi, Beijing (CN); Wei Sun, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 471 days.

(21) Appl. No.: 16/321,485

(22) PCT Filed: May 11, 2018

(86) PCT No.: PCT/CN2018/086547
§ 371 (c)(1),
(2) Date: Jan. 29, 2019

(87) PCT Pub. No.: WO2018/214756
PCT Pub. Date: Nov. 29, 2018

(65) Prior Publication Data
US 2021/0287592 A1    Sep. 16, 2021

(30) Foreign Application Priority Data
May 22, 2017 (CN) .......................... 201710363999.X (51) Int. Cl.
*G09G 3/20* (2006.01)
*G11C 19/28* (2006.01)

(52) U.S. Cl.
CPC .......... *G09G 3/2092* (2013.01); *G11C 19/28* (2013.01); *G09G 2310/0267* (2013.01); *G09G 2310/0286* (2013.01)

(58) Field of Classification Search
CPC ......... G09G 3/2092; G09G 2310/0267; G09G 2310/0286; G11C 19/28
See application file for complete search history.

(56) References Cited

U.S. PATENT DOCUMENTS

2014/0133621 A1    5/2014    Shang

FOREIGN PATENT DOCUMENTS

| CN | 102779493 A | 11/2012 |
| CN | 203966089 U * | 11/2014 |

(Continued)

OTHER PUBLICATIONS

International Search Report (ISR) and written opinion of the international application PCT/CN2018/086547 dated Aug. 16, 2018 (an English translation attached hereto). 14 pages.

*Primary Examiner* — Sahlu Okebato
(74) *Attorney, Agent, or Firm* — Leason Ellis LLP (57) ABSTRACT

A gate drive circuit and a display panel are provided. The gate drive circuit controls, by adding a control module, the potential at a key node of an output module in a touch-control phase, that is, outputting a low-level signal of a signal switching end to a first node of the output module of the current-stage shift register in the touch-control phase, so as to stabilise the potential of the key node, i.e. the first node in the touch-control phase, thereby avoiding the case where the potential at the key node is in a floating state and thus is capacitively coupled and deviates from a stable potential;

(Continued)

and a transition to a display stage before the touch-control state ends is made, and a high-level signal of the signal switching end is output to the first node, so as to pull up the potential at the first node.

14 Claims, 3 Drawing Sheets

(56) References Cited

FOREIGN PATENT DOCUMENTS

| | | | |
|---|---|---|---|
| CN | 104932751 A | 9/2015 | |
| CN | 106155449 A | 11/2016 | |
| CN | 106297621 A | 1/2017 | |
| CN | 106960655 A | 7/2017 | |
| JP | 2011118283 A | 6/2011 | |
| WO | WO-2017036083 A1 * | 3/2017 | ............... G09G 3/20 |

* cited by examiner

GATE DRIVE CIRCUIT AND DISPLAY PANEL

CROSS-REFERENCE TO RELATED PATENT APPLICATIONS

The present application is a U.S. National Stage Application under 35 U.S.C. § 371 of International Patent Application No. PCT/CN2018/086547, filed May 11, 2018, which claims priority to Chinese patent application No. 201710363999.X, filed on May 22, 2017, both of which are incorporated herein by reference in their entireties.

TECHNICAL FIELD

Embodiments of the present disclosure relate to a gate drive circuit and a display panel.

BACKGROUND

Figure 1:
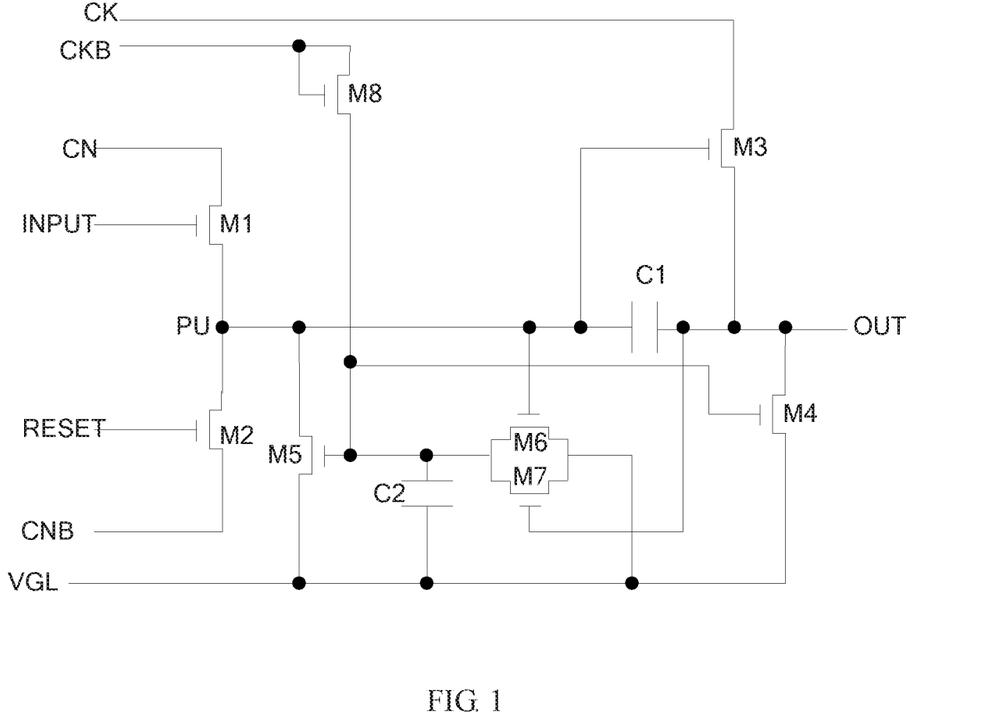
FIG. 1 is a schematic structural diagram of a shift register in the prior art.
Figure 2:
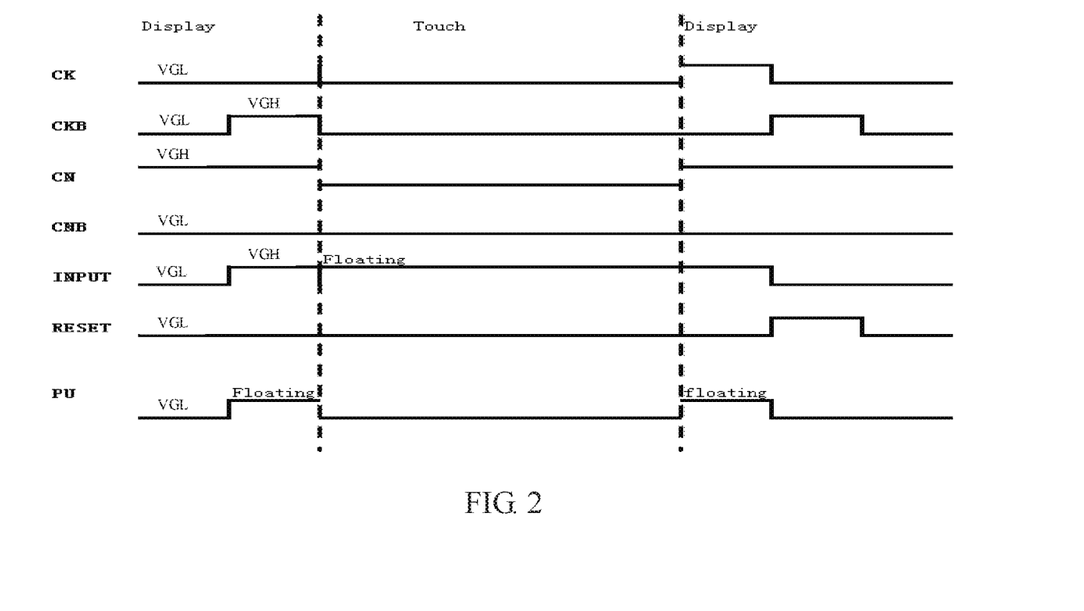
FIG. 2 is an operation timing diagram of a shift register in the prior art.

At present, in a touch-control display panel, a structure of a shift register circuit is shown in FIG. 1, which mainly includes: switching transistors M1~M8 and capacitors C1 and C2; during a touch-control phase (Touch), as shown in FIG. 2, control signals CK, CKB, CN, CNB, RESET of the shift register circuit are all in a low-level state, after the touch-control phase, a display phase (Display) is followed, and a key node PU of a shift register corresponding to a first row of gate lines for displaying images is in a high-level and a Floating state, and it is also kept in the Floating state for a fairly long time (50 us-150 us) during the touch-control phase; after the touch-control phase, the key node PU needs to be further pulled up to ensure a normal output of the shift register, thus ensuring a normal display of the row. However, during the touch-control phase, a level of a touch-control voltage signal is constantly changing, a level signal of the key node PU is in a Floating state, so that the key node PU is easily coupled with the capacitors and deviates from the high-level state. Therefore, this results in that after the touch-control phase, even if the control signal CN becomes a high-level state, a signal of a signal inputting terminal Input is still in a low-level state at this time, so that the switching transistor M1 cannot be turned on at this time, and the potential of the key node PU cannot be pulled up to a standard state of high-level, thereby affecting the normal output of a scan signal via the shift register, and further affecting display performance of the display panel.

Therefore, how to stabilize the potential of the key node of the shift register during the touch-control phase, and ensure that the potential of the key node reaches the standard state after the touch-control phase, so as to ensure the normal output of the shift register, is a technical problem to be solved urgently by those skilled in the art.

SUMMARY

Embodiments of the present disclosure provide a gate drive circuit and a display panel for stabilizing the potential of the key node of the shift register during the touch-control phase and ensuring that the potential of the key node reaches the standard state after the touch-control phase, thereby ensuring the normal output of the shift register.

Embodiments of the present disclosure provide a gate drive circuit, which includes: a plurality of cascaded shift registers in one-to-one correspondence with gate lines; each of the shift registers includes: an output module for inputting a scan signal to a corresponding gate line thereof during a display phase, and a control module for controlling node potential of the output module during a touch-control phase; wherein in a shift register in each stage, a first control terminal of the control module is connected to a first node of the output module of a shift register in a previous stage adjacent thereto, a second control terminal of the control module is configured to input a first control signal, an input terminal of the control module is connected to a signal switching terminal, an output terminal of the control module is connected to a first node of the output module of a shift register in a current stage; during the touch-control phase, the control module is configured to output a low-level signal of the signal switching terminal to the first node of the output module of the shift register in the current stage, under the control of the first node of the output module of the shift register in the previous stage adjacent thereto and the first control signal; during a transition phase from the touch-control phase to the display phase, the control module is configured to output a high-level signal of the signal switching terminal to the first node of the output module of the shift register in the current stage, under the control of the first node of the output module of the shift register in the previous stage adjacent thereto and the first control signal; during the display phase, the output module is configured to input the scan signal to the corresponding gate line, under the control of the first node of the shift register in the current stage.

In a possible example, in the abovementioned gate drive circuit provided by an embodiment of the present disclosure, the control module includes: a first sub-unit and a second sub-unit; wherein a control terminal of the first sub-unit is configured to input the first control signal, an input terminal of the first sub-unit is connected to the signal switching terminal, an output terminal of the first sub-unit is connected to an input terminal of the second sub-unit; the first sub-unit is configured to output a signal of the signal switching terminal to the input terminal of the second sub-unit, under the control of the first control signal; a control terminal of the second sub-unit is connected to the first node of the output module of the shift register in the previous stage adjacent to the shift register in the current stage, an output terminal of the second sub-unit is connected to the first node of the output module of the shift register in the current stage; the second sub-unit is configured to output a signal of the output terminal of the first sub-unit to the first node of the output module of the shift register in the current stage, under the control of the first node of the output module of the shift register in the previous stage adjacent thereto.

In a possible example, the abovementioned gate drive circuit provided by an embodiment of the present disclosure, further includes: a reset module; wherein a control terminal of the reset module is configured to input a second control signal, an input terminal of the reset module is configured to input a low-level signal, an output terminal of the reset module is connected to the input terminal of the second sub-unit; the reset module is configured to output the low-level signal to the input terminal of the second sub-unit, under the control of the second control signal.

In a possible example, in the abovementioned gate drive circuit provided by an embodiment of the present disclosure, the reset module includes: a first switching transistor; a gate electrode of the first switching transistor is configured to input the second control signal, a source electrode of the first switching transistor is configured to input the low-level signal, and a drain electrode of the first switching transistor is connected to the input terminal of the second sub-unit.

In a possible example, in the abovementioned gate drive circuit provided by an embodiment of the present disclosure, the first sub-unit includes: a second switching transistor; a gate electrode of the second switching transistor is configured to input the first control signal, a source electrode of the second switching transistor is connected to the signal switching terminal, and a drain electrode of the second switching transistor is connected to the input terminal of the second sub-unit.

In a possible example, in the abovementioned gate drive circuit provided by an embodiment of the present disclosure, the second sub-unit includes: a third switching transistor; a gate electrode of the third switching transistor is connected to the first node of the output module of the shift register in the previous stage adjacent to the shift register in the current stage, a source electrode of the third switching transistor is connected to the output terminal of the first sub-unit, and a drain electrode of the third switching transistor is connected to the first node of the output module of the shift register in the current stage.

In a possible example, in the abovementioned gate drive circuit provided by an embodiment of the present disclosure, the output module includes: a pull-up unit, a reset unit, a pull-down unit, a control unit and an output unit; wherein a control terminal of the pull-up unit is connected to a signal inputting terminal, an input terminal of the pull-up unit is configured to input a first reference signal, an output terminal of the pull-up unit is connected to the first node of the shift register in the current stage; the pull-up unit is configured to output the first reference signal to the first node of the shift register in the current stage, under the control of the signal inputting terminal; a control terminal of the reset unit is connected to a signal resetting terminal, an input terminal of the reset unit is configured to input a second reference signal, an output terminal of the reset unit is connected to the first node of the shift register in the current stage; the reset unit is configured to output the second reference signal to the first node of the shift register in the current stage, under the control of the signal resetting terminal; a control terminal of the pull-down unit is connected to a second node, an input terminal of the pull-down unit is configured to input a low-level signal, an output terminal of the pull-down unit is connected to the first node of the shift register in the current stage; the pull-down unit is configured to output the low-level signal to the first node of the shift register in the current stage, under the control of the second node; a first control terminal and a first input terminal of the control unit are configured to input a first clock signal, a second control terminal of the control unit is connected to the first node of the shift register in the current stage, a third control terminal of the control unit is connected to an output terminal of the output unit, a second input terminal of the control unit is configured to input the low-level signal, an output terminal of the control unit is connected to the second node; the control unit is configured to output the first clock signal to the second node under the control of the first clock signal, and to output the low-level signal to the second node under the control of the first node of the shift register in the current stage or the output terminal of the output unit; a first control terminal of the output unit is connected to the first node of the shift register in the current stage, a second control terminal of the output unit is connected to the second node, a first input terminal of the output unit is configured to input a second clock signal, a second input terminal of the output unit is configured to input the low-level signal, the output terminal of the output unit is configured to output the scan signal; the output unit is configured to output the second clock signal via the output terminal of the output unit under the control of the first node of the shift register in the current stage, and to output the low-level signal via the output terminal of the output unit under the control of the second node.

In a possible example, in the abovementioned gate drive circuit provided by an embodiment of the present disclosure, the pull-up unit includes: a fourth switching transistor; a gate electrode of the fourth switching transistor is connected to the signal inputting terminal, a source electrode of the fourth switching transistor is configured to input the first reference signal, and a drain electrode of the fourth switching transistor is connected to the first node of the shift register in the current stage.

In a possible example, in the abovementioned gate drive circuit provided by an embodiment of the present disclosure, the reset unit includes: a fifth switching transistor; a gate electrode of the fifth switching transistor is connected to the signal resetting terminal, a source electrode of the fifth switching transistor is configured to input the second reference signal, and a drain electrode of the fifth switching transistor is connected to the first node of the shift register in the current stage.

In a possible example, in the abovementioned gate drive circuit provided by an embodiment of the present disclosure, the pull-down unit includes: a sixth switching transistor; a gate electrode of the sixth switching transistor is connected to the second node, a source electrode of the sixth switching transistor is configured to input the low-level signal, and a drain electrode of the sixth switching transistor is connected to the first node of the shift register in the current stage.

In a possible example, in the abovementioned gate drive circuit provided by an embodiment of the present disclosure, the control unit includes: a seventh switching transistor, an eighth switching transistor and a ninth switching transistor; wherein a gate electrode and a source electrode of the seventh switching transistor are configured to input the first clock signal, and a drain electrode of the seventh switching transistor is connected to the second node; a gate electrode of the eighth switching transistor is connected to the first node of the shift register in the current stage, a source electrode of the eighth switching transistor is configured to input the low-level signal, and a drain electrode of the eighth switching transistor is connected to the second node; a gate electrode of the ninth switching transistor is connected to the output terminal of the output unit, a source electrode of the ninth switching transistor is configured to input the low-level signal, and a drain electrode of the ninth switching transistor is connected to the second node.

In a possible example, in the abovementioned gate drive circuit provided by an embodiment of the present disclosure, the output unit includes: a tenth switching transistor, an eleventh switching transistor and a capacitor; wherein a gate electrode of the tenth switching transistor is connected to the first node of the shift register in the current stage, a source electrode of the tenth switching transistor is configured to input the second clock signal, and a drain electrode of the tenth switching transistor is configured to output the second clock signal; a gate electrode of the eleventh switching transistor is connected to the second node, a source electrode of the eleventh switching transistor is configured to input the low-level signal, and a drain electrode of the eleventh switching transistor is configured to output the low-level signal; the capacitor is coupled between the first node of the shift register in the current stage and the drain electrode of the tenth switching transistor.

In a possible example, in the abovementioned gate drive circuit provided by an embodiment of the present disclosure, the first node of the output module of the shift register in each stage except a first stage and a last stage is connected to the first control terminal of the control module of the shift register in a next stage adjacent thereto; the output terminal of the output module of the shift register in each stage except the first stage and the last stage inputs a trigger signal to the output module of the shift register in the next stage adjacent thereto, and inputs a reset signal to the output module of the shift register in the previous stage adjacent thereto; the first node of the output module of the shift register in the first stage is connected to the first control terminal of the control module of the shift register in a second stage; and the output terminal of the output module of the shift register in the first stage inputs a trigger signal to the output module of the shift register in the second stage; the output terminal of the output module of the shift register in the last stage inputs a reset signal to the output module of the shift register in the previous stage adjacent thereto.

An embodiment of the present disclosure provides a display panel, which includes: the abovementioned gate drive circuit provided by any one embodiment of the present disclosure.

Beneficial effects of the embodiments of the present disclosure include:

The embodiments of the present disclosure provide a gate drive circuit and a display panel, wherein the gate drive circuit can include: a plurality of cascaded shift registers in one-to-one correspondence with gate lines; each of the shift registers includes: an output module for inputting a scan signal to a corresponding gate line thereof during a display phase, and a control module for controlling node potential of the output module during a touch-control phase; wherein in a shift register in each stage, a first control terminal of the control module is connected to a first node of the output module of a shift register in a previous stage adjacent thereto, a second control terminal of the control module is configured to input a first control signal, an input terminal of the control module is connected to a signal switching terminal, and an output terminal of the control module is connected to a first node of the output module of a current-stage; during the touch-control phase, the control module is configured to output a low-level signal of the signal switching terminal to the first node of the output module of the shift register in the current stage, under the control of the first node of the output module of the shift register in the previous stage adjacent thereto and the first control signal; during a transition phase from the touch-control phase to the display phase, the control module is configured to output a high-level signal of the signal switching terminal to the first node of the output module of the shift register in the current stage, under the control of the first node of the output module of the shift register in the previous stage adjacent thereto and the first control signal; during the display phase, the output module is configured to input the scan signal to the corresponding gate line, under the control of the first node of the shift register in the current stage.

The abovementioned gate drive circuit provided by the embodiments of the present disclosure, controls the potential of the key node of the output module during the touch-control phase by adding the control module, that is, during the touch-control phase, the control module outputs the low-level signal of the signal switching terminal to the first node of the output module of the shift register in the current stage, thereby stabilizing the potential of the key node namely the first node during the touch-control phase, avoiding that the potential of the key node is in a Floating state, and is coupled with the capacitor and deviates from a stabilized state; during the transition phase from the touch-control phase to the display phase, the control module outputs the high-level signal of the signal switching terminal to the first node, so as to pull up the potential of the first node, enabling the output module to output the scan signal stably under the control of the first node in a high-level state during the display phase, and ensuring a normal display of the display panel during the display phase.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Figure 3:
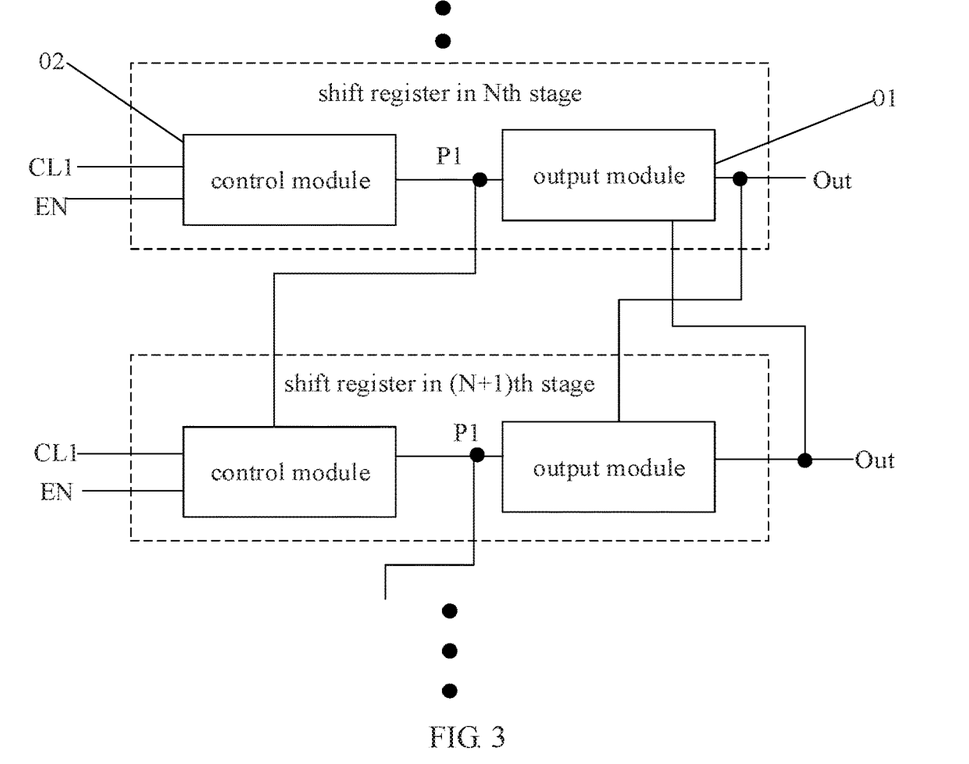
FIG. 3 is a schematic structural diagram of a gate drive circuit provided by an embodiment of the present disclosure.

At least one embodiment of the present disclosure provides a gate drive circuit, as shown in FIG. 3, which includes: a plurality of cascaded shift registers in one-to-one correspondence with gate lines; each of the shift registers includes: an output module 01 for inputting a scan signal to a corresponding gate line thereof during a display phase, and a control module 02 for controlling a node potential of the output module during a touch-control phase. In a shift register in each stage, a first control terminal of the control module 02 is connected to a first node P1-U of the output module 01 of a shift register in a previous stage adjacent thereto, a second control terminal of the control module 02 is configured to input a first control signal CL1, an input terminal of the control module 02 is connected to a signal switching terminal EN, an output terminal of the control module 02 is connected to a first node P1 of the output module 01 of a current stage; during the touch-control phase, the control module 02 is configured to output a low-level signal of the signal switching terminal EN to the first node P1 of the output module 01 of the shift register in the current stage, under the control of the first node P1-U of the output module 01 of the shift register in the previous stage adjacent thereto and the first control signal CL1; during a transition phase from the touch-control phase to the display phase, the control module 02 is configured to output a high-level signal of the signal switching terminal EN to the first node P1 of the output module 01 of the shift register in the current stage, under the control of the first node P1-U of the output module 01 of the shift register in the previous stage adjacent thereto and the first control signal CL1; during the display phase, the output module 01 is configured to input the scan signal to the corresponding gate line via the output terminal Out, under the control of the first node P1 of the shift register in the current stage.

The gate drive circuit provided by the embodiments of the present disclosure, controls the potential of the key node of the output module during the touch-control phase by adding the control module, that is, during the touch-control phase, the control module outputs the low-level signal of the signal switching terminal to the first node of the output module of the shift register in the current stage, thereby stabilizing the potential of the key node namely the first node during the touch-control phase, avoiding that the potential of the key node is in a Floating state, and is coupled with the capacitor and deviates from a stabilized state; during the transition phase from the touch-control phase to the display phase, the control module outputs the high-level signal of the signal switching terminal to the first node, so as to pull up the potential of the first node, enabling the output module to output the scan signal stably under the control of the first node of a high-level state during the display phase, and ensuring a normal display of the display panel during the display phase.

Figure 4:
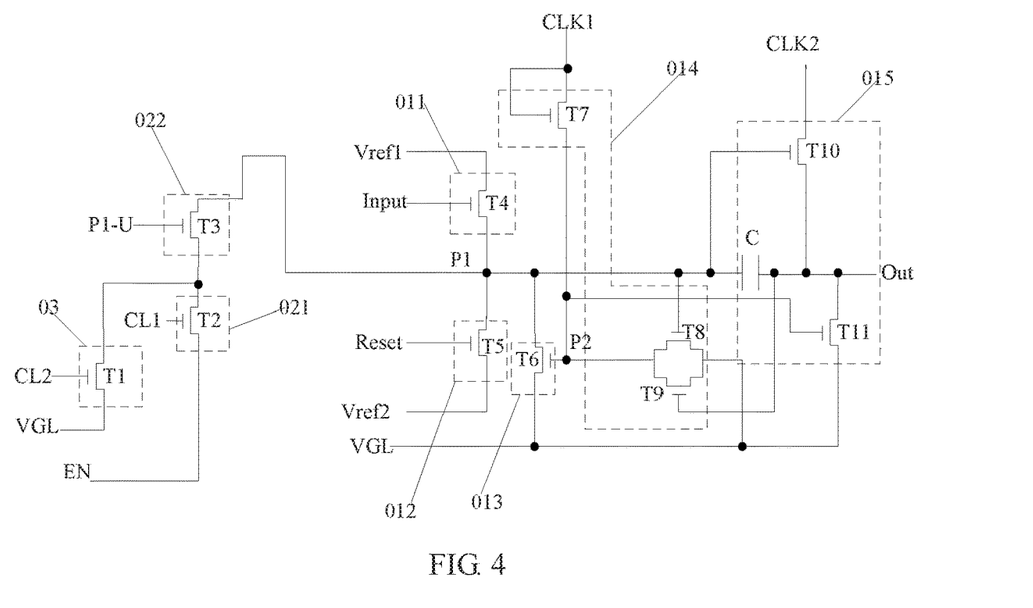
FIG. 4 is a schematic structural diagram of a shift register in a gate drive circuit provided by an embodiment of the present disclosure.

In a possible implementation, in the gate drive circuit provided by an embodiment of the present disclosure, as shown in FIG. 4, the control module 02 can include: a first sub-unit 021 and a second sub-unit 022. A control terminal of the first sub-unit 021 is configured to input the first control signal CL1, an input terminal of the first sub-unit 021 is connected to the signal switching terminal EN, an output terminal of the first sub-unit 021 is connected to an input terminal of the second sub-unit 022; the first sub-unit 021 is configured to output a signal of the signal switching terminal EN to the input terminal of the second sub-unit 022, under the control of the first control signal CL1; a control terminal of the second sub-unit 022 is connected to the first node P1-U of the output module 01 of the shift register in the previous stage adjacent to the shift register in the current stage, an output terminal of the second sub-unit 022 is connected to the first node P1 of the output module 01 of the shift register in the current stage; the second sub-unit 022 is configured to output a signal of the output terminal of the first sub-unit 021 to the first node P1 of the output module 01 of the shift register in the current stage, under the control of the first node P1-U of the output module 01 of the shift register in the previous stage adjacent thereto.

Specifically, in the gate drive circuit provided by the embodiment of the present disclosure, the control module can include: the first sub-unit and the second sub-unit. The first sub-unit is configured to output the signal of the signal switching terminal to the input terminal of the second sub-unit, then the second sub-unit outputs the signal of the signal switching terminal to the key node namely the first node of the output module, thereby realizing that during the touch-control phase, the low-level signal is input to the key node namely the first node for stabilizing the potential of the first node; during the transition phase from the touch-control phase to the display phase, the high-level signal of the signal switching terminal is output to the key node namely the first node of the output module, so as to pull up the potential of the first node for ensuring a normal output of the shift register.

In a possible implementation, the gate drive circuit provided by an embodiment of the present disclosure, as shown in FIG. 4, can further include: a reset module 03; a control terminal of the reset module 03 is configured to input a second control signal CL2, an input terminal of the reset module 03 is configured to input a low-level signal VGL, an output terminal of the reset module 03 is connected to the input terminal of the second sub-unit 022; the reset module 03 is configured to output the low-level signal VGL to the input terminal of the second sub-unit 022, under the control of the second control signal CL2. Specifically, after the touch-control phase, the low-level signal can be output to the input terminal of the second sub-unit via the added reset module, so as to pull down the signal of the input terminal of the second sub-unit, thereby avoiding a wrong pulling up in next operation.

In a possible implementation, in the gate drive circuit provided by an embodiment of the present disclosure, as shown in FIG. 4, the reset module 03 can include: a first switching transistor T1; a gate electrode of the first switching transistor T1 is configured to input the second control signal CL2, a source electrode of the first switching transistor T1 is configured to input the low-level signal VGL, and a drain electrode of the first switching transistor T1 is connected to the input terminal of the second sub-unit 022. Specifically, the first switching transistor can be turned on under the control of the second control signal, and the first switching transistor which is turned on can output the low-level signal to the input terminal of the second sub-unit.

In a possible implementation, in the gate drive circuit provided by an embodiment of the present disclosure, as shown in FIG. 4, the first sub-unit 021 can include: a second switching transistor T2; a gate electrode of the second switching transistor T2 is configured to input the first control signal CL1, a source electrode of the second switching transistor T2 is connected to the signal switching terminal EN, and a drain electrode of the second switching transistor T2 is connected to the input terminal of the second sub-unit 022. Specifically, the second switching transistor can be turned on under the control of the first control signal, and the second switching transistor which is turned on can output the signal of the signal switching terminal to the input terminal of the second sub-unit.

In a possible implementation, in the gate drive circuit provided by an embodiment of the present disclosure, as shown in FIG. 4, the second sub-unit 022 can include: a third switching transistor T3; a gate electrode of the third switching transistor T3 is connected to the first node P1-U of the output module 01 of the shift register in the previous stage adjacent to the shift register in the current stage, a source electrode of the third switching transistor T3 is connected to the output terminal of the first sub-unit 021, and a drain electrode of the third switching transistor T3 is connected to the first node P1 of the output module 01 of the shift register in the current stage. Specifically, the third switching transistor can be turned on under the control of the first node of the output module of the shift register in the previous stage adjacent to the shift register in the current stage, and the third switching transistor which is turned on can output the signal of the output terminal of the first sub-unit to the first node of the output module of the shift register in the current stage.

In a possible implementation, in the gate drive circuit provided by an embodiment of the present disclosure, as shown in FIG. 4, the output module can include: a pull-up unit 011, a reset unit 012, a pull-down unit 013, a control unit 014 and an output unit 015. A control terminal of the pull-up unit 011 is connected to a signal inputting terminal Input, an input terminal of the pull-up unit 011 is configured to input a first reference signal Vref1, an output terminal of the pull-up unit 011 is connected to the first node P1 of the shift register in the current stage; the pull-up unit 011 is configured to output the first reference signal Vref1 to the first node P1 of the shift register in the current stage, under the control of the signal inputting terminal Input; a control terminal of the reset unit 012 is connected to a signal resetting terminal Reset, an input terminal of the reset unit 012 is configured to input a second reference signal Vref2, an output terminal of the reset unit 012 is connected to the first node P1 of the shift register in the current stage; the reset unit 012 is configured to output the second reference signal Vref2 to the first node P1 of the shift register in the current stage, under the control of the signal resetting terminal Reset; a control terminal of the pull-down unit 013 is connected to a second node P2, an input terminal of the pull-down unit 013 is configured to input the low-level signal VGL, an output terminal of the pull-down unit 013 is connected to the first node P1 of the shift register in the current stage; the pull-down unit 013 is configured to output the low-level signal VGL to the first node P1 of the shift register in the current stage, under the control of the second node P2; a first control terminal and a first input terminal of the control unit 014 are configured to input a first clock signal CLK1, a second control terminal of the control unit 014 is connected to the first node P1 of the shift register in the current stage, a third control terminal of the control unit 014 is connected to an output terminal of the output unit 015, a second input terminal of the control unit 014 is configured to input the low-level signal VGL, an output terminal of the control unit 014 is connected to the second node P2; the control unit 014 is configured to output the first clock signal CLK1 to the second node P2 under the control of the first clock signal CLK1, and to output the low-level signal VGL to the second node P2 under the control of the first node P1 of the shift register in the current stage or the output terminal of the output unit 015; a first control terminal of the output unit 015 is connected to the first node P1 of the shift register in the current stage, a second control terminal of the output unit 015 is connected to the second node P2, a first input terminal of the output unit 015 is configured to input a second clock signal CLK2, a second input terminal of the output unit is configured to input the low-level signal VGL, the output terminal of the output unit 015 is configured to output the scan signal; the output unit 015 is configured to output the second clock signal CLK2 via the output terminal of the output unit 015 under the control of the first node P1 of the shift register in the current stage, and to output the low-level signal VGL via the output terminal of the output unit 015 under the control of the second node P2.

Specifically, in the gate drive circuit provided by an embodiment of the present disclosure, the output module is configured to input the scan signal to a corresponding gate line thereof during the display phase to implement a normal gate driving function, wherein the output module includes the pull-up unit, the reset unit, the pull-down unit, the control unit and the output unit. Each unit completes a corresponding function under the control of control signal(s) thereof, thereby realizing the normal output of the output module.

In a possible implementation, in the gate drive circuit provided by an embodiment of the present disclosure, as shown in FIG. 4, the pull-up unit 011 can include: a fourth switching transistor T4; a gate electrode of the fourth switching transistor T4 is connected to the signal inputting terminal Input, a source electrode of the fourth switching transistor T4 is configured to input the first reference signal Vref1, and a drain electrode of the fourth switching transistor T4 is connected to the first node P1 of the shift register in the current stage. Specifically, the fourth switching transistor can be turned on under the control of the signal inputting terminal, and the fourth switching transistor which is turned on can output the first reference signal to the first node.

In a possible implementation, in the gate drive circuit provided by an embodiment of the present disclosure, as shown in FIG. 4, the reset unit 012 can include: a fifth switching transistor T5; a gate electrode of the fifth switching transistor T5 is connected to the signal resetting terminal Reset, a source electrode of the fifth switching transistor T5 is configured to input the second reference signal Vref2, and a drain electrode of the fifth switching transistor T5 is connected to the first node P1 of the shift register in the current stage. Specifically, the fifth switching transistor can be turned on under the control of the signal resetting terminal, and the fifth switching transistor which is turned on can output the second reference signal to the first node.

In a possible implementation, in the gate drive circuit provided by an embodiment of the present disclosure, as shown in FIG. 4, the pull-down unit 013 can include: a sixth switching transistor T6; a gate electrode of the sixth switching transistor T6 is connected to the second node P2, a source electrode of the sixth switching transistor T6 is configured to input the low-level signal VGL, and a drain electrode of the sixth switching transistor T6 is connected to the first node P1 of the shift register in the current stage. Specifically, the sixth switching transistor can be turned on under the control of the second node, and the sixth switching transistor which is turned on can output the low-level signal to the first node.

In a possible implementation, in the gate drive circuit provided by an embodiment of the present disclosure, as shown in FIG. 4, the control unit 014 can include: a seventh switching transistor T7, an eighth switching transistor T8 and a ninth switching transistor T9. A gate electrode and a source electrode of the seventh switching transistor T7 are configured to input the first clock signal CLK1, and a drain electrode of the seventh switching transistor T7 is connected to the second node P2; a gate electrode of the eighth switching transistor T8 is connected to the first node P1 of the shift register in the current stage, a source electrode of the eighth switching transistor T8 is configured to input the low-level signal VGL, and a drain electrode of the eighth switching transistor T8 is connected to the second node P2; a gate electrode of the ninth switching transistor T9 is connected to the output terminal of the output unit 015, a source electrode of the ninth switching transistor T9 is configured to input the low-level signal VGL, and a drain electrode of the ninth switching transistor T9 is connected to the second node P2. Specifically, upon the seventh switching transistor being turned on, the first clock signal can be output to the second node; upon the eighth switching transistor and the ninth switching transistor being turned on, the low-level signal can be output to the second node.

In a possible implementation, in the gate drive circuit provided by an embodiment of the present disclosure, as shown in FIG. 4, the output unit 015 includes: a tenth switching transistor T10, an eleventh switching transistor T11 and a capacitor C. A gate electrode of the tenth switching transistor T10 is connected to the first node P1 of the shift register in the current stage, a source electrode of the tenth switching transistor T10 is configured to input the second clock signal CLK2, and a drain electrode of the tenth switching transistor T10 is configured to output the second clock signal CLK2; a gate electrode of the eleventh switching transistor T11 is connected to the second node P2, a source electrode of the eleventh switching transistor T11 is configured to input the low-level signal VGL, and a drain electrode of the eleventh switching transistor T11 is configured to output the low-level signal VGL; the capacitor C is coupled between the first node P1 of the shift register in the current stage and the drain electrode of the tenth switching transistor T10. Specifically, the tenth switching transistor which is turned on can output the second clock signal, and the eleventh switching transistor which is turned on can output the low-level signal.

It should be noted that, the switching transistors mentioned in the above embodiments of the present disclosure may be a thin film transistor (TFT) or a metal oxide semiconductor (MOS) field effect transistor, which is not limited herein. In a possible implementation, the source electrode and the drain electrode of these transistors can be interchanged without specific distinction. The embodiments are illustrated by taking the thin film transistor as an example.

Figure 5:
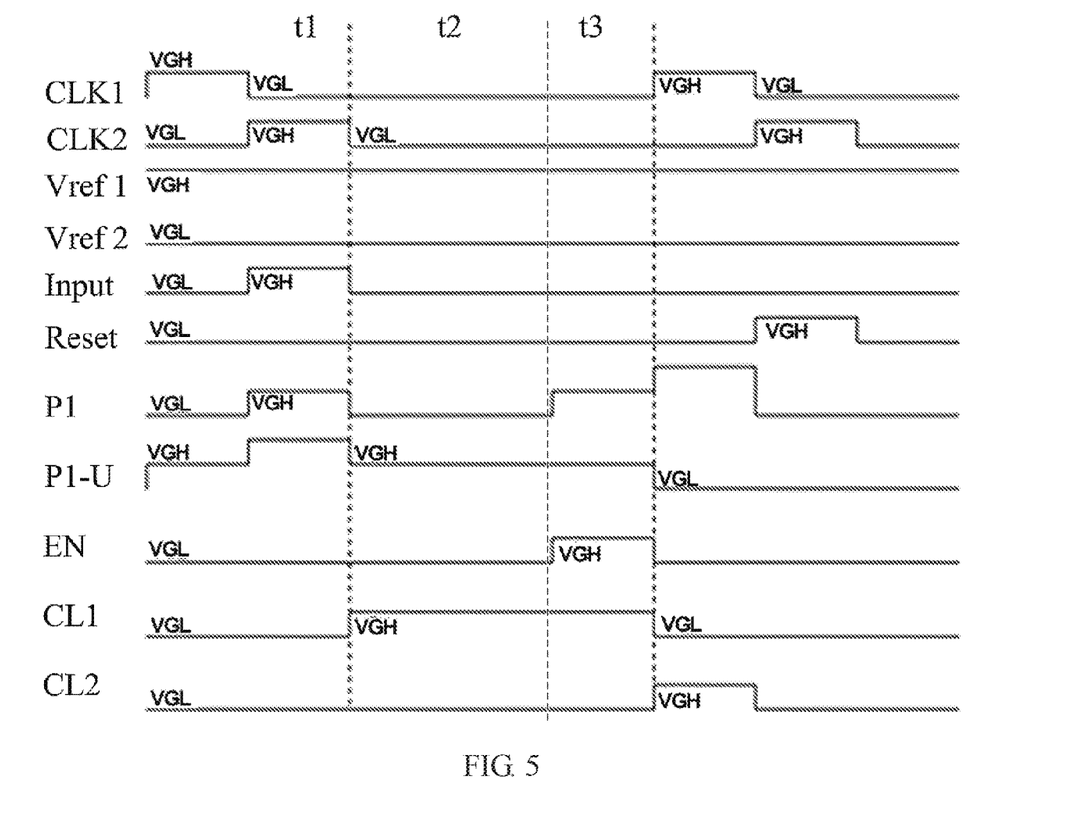
FIG. 5 is an operation timing diagram of a shift register provided by an embodiment of the present disclosure.

Hereinafter, operation process of the shift register in the gate drive circuit provided by the embodiments of the present disclosure is described, with reference to the shift register of the gate drive circuit shown in FIG. 4 and the input/output timing diagram shown in FIG. 5 corresponding to the shift register in FIG. 4. Specifically, three phases t1~t3 in the input/output timing diagram, as shown in FIG. 5, are selected. In the following description, VGH represents a high-level signal, and VGL represents a low-level signal.

During the t1 phase, that is the display phase, the level changes of the signals CLK1, CLK2, Vref1, Vref2, Input, Reset, P1 (the first node P1 of the shift register in the current stage), P1-U (the first node of the shift register in the previous stage adjacent to the shift register in the current stage), EN, CL1, CL2 are shown in FIG. 5. Because CL1=0 during the display phase, the second switching transistor T2 is turned off, the third switching transistor T3 cannot output the signal of the signal switching terminal EN to the first node of the output module, so the operation process of the output module will not be affected. The operation process of the output module is the same as that of a shift register in the prior art, which is not described in detail here.

During the t2 phase, that is the touch-control phase, CLK1=VGL, CLK2=VGL, Vref1=VGH, Vref2=VGL, Input=VGL, Reset=VGL, P1=VGL, P1-U=VGH, EN=VGL, CL1=VGH, CL2=VGL. Because P1-U=VGH and CL1=VGH, the second switching transistor T2 and the third switching transistor T3 are turned on; the second switching transistor T2 which is turned on outputs the VGL signal of the signal switching terminal EN to the source electrode of the third switching transistor T3, and then the third switching transistor T3 which is turned on outputs the VGL signal to the first node P1 of shift register in the current stage, thus stabilizing the potential of the first node P1 during the touch-control phase, and avoiding a deviation of the potential of the first node P1 caused by the coupling of the capacitor.

During the t3 phase, that is the transition phase from the touch-control phase to the display phase, CLK1=VGL, CLK2=VGL, Vref1=VGH, Vref2=VGL, Input=VGL, Reset=VGL, P1=VGH, P1-U=VGH, EN=VGH, CL1=VGH, CL2=VGL. Because P1-U=VGH and CL1=VGH, the second switching transistor T2 and the third switching transistor T3 are turned on; the second switching transistor T2 which is turned on outputs the VGH signal of the signal switching terminal EN to the source electrode of the third switching transistor T3, and then the third switching transistor T3 which is turned on outputs the VGH signal to the first node P1 of the shift register in the current stage, thereby pulling up the potential of the first node P1, ensuring that the first node P1 is in a high-level after the touch-control phase, and further, ensuring that the output module outputs the scan signal normally. In addition, after entering the following display phase, the second control signal CL2 becomes a high-level, thus turning on the first switching transistor T1; the first transistor T1 which is turned on outputs the low-level signal VGL to the source electrode of the third switching transistor T3, thereby pulling down the potential of the source electrode of the third switching transistor T3, and avoiding a wrong pulling up in next operation.

In a possible implementation, in the gate drive circuit provided by an embodiment of the present disclosure, as shown in FIG. 3, only the shift registers in the Nth stage and (N+1)th stage of are shown. The first node of the output module of the shift register in each stage except a first stage and a last stage is connected to the first control terminal of the control module of the shift register in the next stage adjacent thereto; the output terminal of the output module of the shift register in each stage except the first stage and the last stage, inputs a trigger signal to the output module of the shift register in the next stage adjacent thereto, and inputs a reset signal to the output module of the shift register in the previous stage adjacent thereto; the first node of the output module of the shift register in the first stage is connected to the first control terminal of the control module of the shift register in a second stage; and the output terminal of the output module of the shift register in the first stage inputs a trigger signal to the output module of the shift register in the second stage; the output terminal of the output module of the shift register in the last stage inputs a reset signal to the output module of the shift register in the previous stage adjacent thereto.

Based on the same inventive concept, an embodiment of the present disclosure provides a display panel, which includes the gate drive circuit provided by any one embodiment of the present disclosure. The display panel may be applied to any product or component with a display function, such as a mobile phone, a tablet computer, a television, a display device, a notebook computer, a digital photo frame, a navigator, etc. Because the principle of solving problems in the display panel is similar to that of the gate drive circuit, an example of the display panel can be referred to the example of the gate drive circuit, and the repeated description is omitted.

The embodiments of the present disclosure provide a gate drive circuit and a display panel, the gate drive circuit can include: a plurality of cascaded shift registers in one-to-one correspondence with gate lines; each of the shift registers includes: an output module for inputting a scan signal to a corresponding gate line thereof during a display phase, and a control module for controlling node potential of the output module during a touch-control phase. In a shift register in each stage, a first control terminal of the control module is connected to a first node of the output module of a shift register in a previous stage adjacent thereto, a second control terminal of the control module is configured to input a first control signal, an input terminal of the control module is connected to a signal switching terminal, an output terminal of the control module is connected to a first node of the output module of the shift register in current-stage; during the touch-control phase, the control module is configured to output a low-level signal of the signal switching terminal to the first node of the output module of the shift register in the current stage, under the control of the first node of the output module of the shift register in the previous stage adjacent thereto and the first control signal; during a transition phase from the touch-control phase to the display phase, the control module is configured to output a high-level signal of the signal switching terminal to the first node of the output module of the shift register in the current stage, under the control of the first node of the output module of the shift register in the previous stage adjacent thereto and the first control signal; during the display phase, the output module is configured to input the scan signal to the corresponding gate line, under the control of the first node of the shift register in the current stage.

The gate drive circuit provided by the embodiments of the present disclosure, controls the potential of the key node of an output module during the touch-control phase by adding the control module, that is, during the touch-control phase, the control module outputs the low-level signal of the signal switching terminal to the first node of the output module of the shift register in the current stage, thereby stabilizing the potential of the key node namely the first node during the touch-control phase, avoiding that the potential of the key node is in a Floating state, and is coupled with the capacitor and deviates from a stabilized state; during the transition phase from the touch-control phase to the display phase, the control module outputs the high-level signal of the signal switching terminal to the first node, so as to pull up the potential of the first node, enabling the output module to output the scan signal stably under the control of the first node of a high-level state during the display phase, and ensuring a normal display of the display panel during the display phase.

What have been described above are only specific examples of the present disclosure, the protection scope of the present disclosure is not limited thereto. Therefore, the protection scope of the present disclosure should be based on the protection scope of the claims.

What is claimed is:

1. A gate drive circuit, comprising:
a plurality of cascaded shift registers in one-to-one correspondence with gate lines; each of the shift registers comprises: an output module for inputting a scan signal to a corresponding gate line during a display phase, and a control module for controlling a node potential of the output module during a touch-control phase; wherein
in a shift register in each stage, a first control terminal of the control module is connected to a first node of the output module of a shift register in a previous stage adjacent thereto, a second control terminal of the control module is configured to input a first control signal, an input terminal of the control module is connected to a signal switching terminal, and an output terminal of the control module is connected to a first node of the output module of a shift register in a current stage;
during the touch-control phase, the control module is configured to output a low-level signal of the signal switching terminal to the first node of the output module of the shift register in the current stage, under the control of the first node of the output module of the shift register in the previous stage adjacent thereto and the first control signal;
during a transition phase from the touch-control phase to the display phase, the control module is configured to output a high-level signal of the signal switching terminal to the first node of the output module of the shift register in the current stage, under the control of the first node of the output module of the shift register in the previous stage adjacent thereto and the first control signal;
during the display phase, the output module is configured to input the scan signal to the corresponding gate line, under the control of the first node of the shift register in the current stage.

2. The gate drive circuit according to claim 1, wherein the control module comprises: a first sub-unit and a second sub-unit; wherein
a control terminal of the first sub-unit is configured to input the first control signal, an input terminal of the first sub-unit is connected to the signal switching terminal, an output terminal of the first sub-unit is connected to an input terminal of the second sub-unit; the first sub-unit is configured to output a signal of the signal switching terminal to the input terminal of the second sub-unit, under the control of the first control signal;
a control terminal of the second sub-unit is connected to the first node of the output module of the shift register in the previous stage adjacent thereto, an output terminal of the second sub-unit is connected to the first node of the output module of the shift register in the current stage; the second sub-unit is configured to output a signal of the output terminal of the first sub-unit to the first node of the output module of the shift register in the current stage, under the control of the first node of the output module of the shift register in the previous stage adjacent thereto.

3. The gate drive circuit according to claim 2, further comprising: a reset module;
wherein a control terminal of the reset module is configured to input a second control signal, an input terminal of the reset module is configured to input a low-level signal, an output terminal of the reset module is connected to the input terminal of the second sub-unit; the reset module is configured to output the low-level signal to the input terminal of the second sub-unit, under the control of the second control signal.

4. The gate drive circuit according to claim 3, wherein the reset module comprises: a first switching transistor;
a gate electrode of the first switching transistor is configured to input the second control signal, a source electrode of the first switching transistor is configured to input the low-level signal, and a drain electrode of the first switching transistor is connected to the input terminal of the second sub-unit.

5. The gate drive circuit according to claim 2, wherein the first sub-unit comprises: a second switching transistor;
a gate electrode of the second switching transistor is configured to input the first control signal, a source electrode of the second switching transistor is connected to the signal switching terminal, and a drain electrode of the second switching transistor is connected to the input terminal of the second sub-unit.

6. The gate drive circuit according to claim 2, wherein the second sub-unit comprises: a third switching transistor;
a gate electrode of the third switching transistor is connected to the first node of the output module of the shift register in the previous stage adjacent to the shift register in the current stage, a source electrode of the third switching transistor is connected to the output terminal of the first sub-unit, and a drain electrode of the third switching transistor is connected to the first node of the output module of the shift register in the current stage.

7. The gate drive circuit according to claim 1, wherein the output module comprises: a pull-up unit, a reset unit, a pull-down unit, a control unit and an output unit; wherein
a control terminal of the pull-up unit is connected to a signal inputting terminal, an input terminal of the pull-up unit is configured to input a first reference signal, an output terminal of the pull-up unit is connected to the first node of the shift register in the current stage; the pull-up unit is configured to output the first reference signal to the first node of the shift register in the current stage, under the control of the signal inputting terminal;
a control terminal of the reset unit is connected to a signal resetting terminal, an input terminal of the reset unit is configured to input a second reference signal, an output terminal of the reset unit is connected to the first node of the shift register in the current stage; the reset unit is configured to output the second reference signal to the first node of the shift register in the current stage, under the control of the signal resetting terminal;
a control terminal of the pull-down unit is connected to a second node, an input terminal of the pull-down unit is configured to input a low-level signal, an output terminal of the pull-down unit is connected to the first node of the shift register in the current stage; the pull-down unit is configured to output the low-level signal to the first node of the shift register in the current stage, under the control of the second node;
a first control terminal and a first input terminal of the control unit are configured to input a first clock signal, a second control terminal of the control unit is connected to the first node of the shift register in the current stage, a third control terminal of the control unit is connected to an output terminal of the output unit, a second input terminal of the control unit is configured to input the low-level signal, an output terminal of the control unit is connected to the second node; the control unit is configured to output the first clock signal to the second node under the control of the first clock signal, and to output the low-level signal to the second node under the control of the first node of the shift register in the current stage or the output terminal of the output unit;
a first control terminal of the output unit is connected to the first node of the shift register in the current stage, a second control terminal of the output unit is connected to the second node, a first input terminal of the output unit is configured to input a second clock signal, a second input terminal of the output unit is configured to input the low-level signal, the output terminal of the output unit is configured to output the scan signal; the output unit is configured to output the second clock signal via the output terminal of the output unit under the control of the first node of the shift register in the current stage, and to output the low-level signal via the output terminal of the output unit under the control of the second node.

8. The gate drive circuit according to claim 7, wherein the pull-up unit comprises: a fourth switching transistor;
a gate electrode of the fourth switching transistor is connected to the signal inputting terminal, a source electrode of the fourth switching transistor is configured to input the first reference signal, and a drain electrode of the fourth switching transistor is connected to the first node of the shift register in the current stage.

9. The gate drive circuit according to claim 7, wherein the reset unit comprises: a fifth switching transistor;
a gate electrode of the fifth switching transistor is connected to the signal resetting terminal, a source electrode of the fifth switching transistor is configured to input the second reference signal, and a drain electrode of the fifth switching transistor is connected to the first node of the shift register in the current stage.

10. The gate drive circuit according to claim 7, wherein the pull-down unit comprises: a sixth switching transistor;
a gate electrode of the sixth switching transistor is connected to the second node, a source electrode of the sixth switching transistor is configured to input the low-level signal, and a drain electrode of the sixth switching transistor is connected to the first node of the shift register in the current stage.

11. The gate drive circuit according to claim 7, wherein the control unit comprises: a seventh switching transistor, an eighth switching transistor and a ninth switching transistor; wherein
a gate electrode and a source electrode of the seventh switching transistor are configured to input the first clock signal, and a drain electrode of the seventh switching transistor is connected to the second node;
a gate electrode of the eighth switching transistor is connected to the first node of the shift register in the current stage, a source electrode of the eighth switching transistor is configured to input the low-level signal, and a drain electrode of the eighth switching transistor is connected to the second node;
a gate electrode of the ninth switching transistor is connected to the output terminal of the output unit, a source electrode of the ninth switching transistor is configured to input the low-level signal, and a drain electrode of the ninth switching transistor is connected to the second node.

12. The gate drive circuit according to claim 7, wherein the output unit comprises:
a tenth switching transistor, an eleventh switching transistor and a capacitor; wherein a gate electrode of the tenth switching transistor is connected to the first node of the shift register in the current stage, a source electrode of the tenth switching transistor is configured to input the second clock signal, and a drain electrode of the tenth switching transistor is configured to output the second clock signal;
a gate electrode of the eleventh switching transistor is connected to the second node, a source electrode of the eleventh switching transistor is configured to input the low-level signal, and a drain electrode of the eleventh switching transistor is configured to output the low-level signal;
the capacitor is coupled between the first node of the shift register in the current stage and the drain electrode of the tenth switching transistor.

13. The gate drive circuit according to claim 1, wherein the first node of the output module of the shift register in each stage except a first stage and a last stage is connected to the first control terminal of the control module of the shift register in a next stage adjacent thereto;
the output terminal of the output module of the shift register in each stage except the first stage and the last stage inputs a trigger signal to the output module of the shift register in the next stage adjacent thereto, and inputs a reset signal to the output module of the shift register in the previous stage adjacent thereto;

the first node of the output module of the shift register in the first stage is connected to the first control terminal of the control module of the shift register in a second stage; and the output terminal of the output module of the shift register in the first stage inputs a trigger signal to the output module of the shift register in the second stage;

the output terminal of the output module of the shift register in the last stage inputs a reset signal to the output module of the shift register in the previous stage adjacent thereto.

14. A display panel, comprising: the gate drive circuit according to claim 1.

* * * * *